United States Patent
Kingston et al.

(10) Patent No.: US 9,214,915 B1
(45) Date of Patent: Dec. 15, 2015

(54) MODIFYING AN ESTIMATED GAIN PROFILE OF AN AMPLIFIER

(71) Applicant: L-3 Communications Corp., New York, NY (US)

(72) Inventors: Samuel C. Kingston, Salt Lake City, UT (US); Jason J. Wilden, South Jordon, UT (US); Radivoje Zarubica, Sandy, UT (US); Thomas R. Giallorenzi, Riverton, UT (US)

(73) Assignee: L-3 Communications Corp., New York, NY (US)

( * ) Notice: Subject to any disclaimer, the term of this patent is extended or adjusted under 35 U.S.C. 154(b) by 100 days.

(21) Appl. No.: 13/915,997

(22) Filed: Jun. 12, 2013

(51) Int. Cl.
*H03G 3/20* (2006.01)
*H03G 3/30* (2006.01)

(52) U.S. Cl.
CPC .................................. *H03G 3/3042* (2013.01)

(58) Field of Classification Search
CPC .................................................. H03G 3/3042
USPC .......................................................... 330/129
See application file for complete search history.

(56) References Cited

U.S. PATENT DOCUMENTS

| | | | |
|---|---|---|---|
| 6,449,463 B1 * | 9/2002 | Schiff | 455/69 |
| 6,563,891 B1 * | 5/2003 | Eriksson et al. | 375/345 |
| 2003/0002452 A1 | 1/2003 | Sahota | |
| 2003/0062950 A1 | 4/2003 | Hamada et al. | |
| 2012/0252389 A1 | 10/2012 | Krishnan et al. | |
| 2013/0002357 A1 | 1/2013 | Thomsen et al. | |

OTHER PUBLICATIONS

"Kalman Filters for Dummies" (Downloaded from the Internet Jan. 22, 2013), 4 pages.
"What Is PID—Tutorial Overview," (Downloaded from the Internet Jan. 22, 2013), 5 pages.
"Introduction to Bayesian Filtering," Process Software (Downloaded from the Internet Jan. 22, 2013), 8 pages.
Welch et al., "An Introduction to the Kalman Filter," Dept. of Computer Science, University of North Carolina at Chapel Hill, (Jul. 24, 2006), 16 pages.

* cited by examiner

*Primary Examiner* — Khanh V Nguyen
*Assistant Examiner* — Khiem Nguyen
(74) *Attorney, Agent, or Firm* — Kirton | McConkie

(57) ABSTRACT

The estimated gain profile of an amplifier can be modified during operation of the amplifier utilizing detected values of the amplification level of signals produced by the amplifier. The amplification levels can be detected at a location that is remote from the amplifier. New expected amplification levels can be determined for corresponding control signal values in the estimated gain profile. Digital filtering such as Kalman filtering can be used to determine the new expected amplification levels. The estimated gain profile can be modified with the new expected amplification levels.

23 Claims, 8 Drawing Sheets

Figure 13

$$P = \begin{vmatrix} \Gamma^0 & \Gamma^1 & \Gamma^2 & \Gamma^3 & \ldots & \Gamma^{N-1} & \Gamma^N & 0 \\ \Gamma^1 & \Gamma^0 & \Gamma^1 & \Gamma^2 & \ldots & \Gamma^{N-2} & \Gamma^{N-1} & 0 \\ \Gamma^2 & \Gamma^1 & \Gamma^0 & \Gamma^1 & \ldots & \Gamma^{N-3} & \Gamma^{N-2} & 0 \\ \Gamma^3 & \Gamma^2 & \Gamma^1 & \Gamma^0 & \ldots & \Gamma^{N-4} & \Gamma^{N-3} & 0 \\ \vdots & \vdots & \vdots & \vdots & \ddots & \vdots & \vdots & \vdots \\ \Gamma^{N-1} & \Gamma^{N-2} & \Gamma^{N-3} & \Gamma^{N-4} & \ldots & \Gamma^0 & \Gamma^1 & 0 \\ \Gamma^N & \Gamma^{N-1} & \Gamma^{N-2} & \Gamma^{N-3} & \ldots & \Gamma^1 & \Gamma^0 & 0 \\ 0 & 0 & 0 & 0 & \ldots & 0 & 0 & X \end{vmatrix}$$

Figure 14

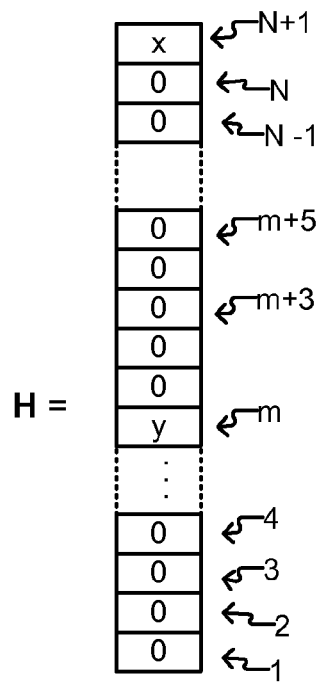

US 9,214,915 B1

MODIFYING AN ESTIMATED GAIN PROFILE OF AN AMPLIFIER

BACKGROUND

An amplifier is an electronic component that amplifies an input signal to produce an amplified output signal. A variable gain amplifier is a type of amplifier that can be set to output signals at different amplification levels. That is, a control input to a variable gain amplifier controls the level of amplification by which the amplifier amplifies an input signal. A variable gain amplifier can be characterized by an estimated gain profile that maps values of the control input to expected amplification levels of the output signal. Due to various causes, however, the actual amplification level of a signal output by the amplifier in response to a particular value of the control input is sometimes different than the expected amplification level from the estimated gain profile. For example, the estimated gain profile of the amplifier might have been imprecisely determined. As another example, the estimated gain profile might have been determined in, for example, a factory setting and thus under different operating conditions than the conditions in which the amplifier may later be used. Moreover, the characteristics, including the gain profile, of an amplifier can change during operation of the amplifier due to, for example, changing operating and ambient conditions such as temperature and the like. For such reasons, it is typically necessary to operate an amplifier with a sufficient guard band to account for such uncertainties in the estimated gain profile of the amplifier. The greater the amplification level at which the amplifier is operated, however, the more power the amplifier uses, which can affect power costs, battery life in battery powered systems, performance in code division multiple access (CDMA) communications systems, and have other adverse affects.

In some embodiments, the instant invention can estimate the gain profile of an amplifier and/or modify an estimated gain profile of an amplifier during operation of the amplifier. This can, in some embodiments, improve the precision of the estimated gain profile and thus allow operation with a reduced guard band. In some embodiments, this can reduce power costs, improve battery life, improve performance of a CDMA communications system, and/or provide other benefits.

SUMMARY

In some embodiments of the invention, a process of modifying an estimated gain profile of an electronic amplifier can include outputting from the amplifier an output signal while the amplifier is set by a control signal value to produce the output signal at an expected amplification level. The process can further include receiving a detected amplification level of the output signal, and modifying the estimated gain profile utilizing the detected amplification level and the expected amplification level.

In some embodiments of the invention, a digital electronic control module can include a digital memory and an electronic digital controller. The digital memory can include an estimated gain profile that maps control signal values to expected amplification levels of an electronic amplifier. The electronic digital controller can be configured to modify the estimated gain profile in the digital memory in accordance with a detected amplification level of a signal output by the amplifier while the amplifier is set with one of the control signal values to produce the output signal at one of the expected amplification levels.

BRIEF DESCRIPTION OF THE DRAWINGS

FIG. 13 illustrates an example of initialization of a covariance matrix for use in the process of FIG. 11 according to some embodiments of the invention.

FIG. 14 illustrates an example of a column vector for use in the process of FIG. 11 according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

The following symbols are used herein as follows: ^ denotes an estimated value; * means mathematical multiplication; + means mathematical addition; − means mathematical subtraction; / means mathematical division; = means mathematical equality; and $^T$ denotes a transposed matrix.

As used herein, "substantially" means sufficient to work for the intended purpose. The term "ones" means more than one.

In some embodiments, the present invention modifies the estimated gain profile of an amplifier utilizing a detected value of the amplification level of an output signal output by the amplifier. Some embodiments of the invention are thus capable of creating a relatively precise estimated gain profile and/or updating the estimated gain profile of an amplifier as, for example, operating characteristics, ambient conditions, and/or other factors change during operation of the amplifier.

Figure 1:
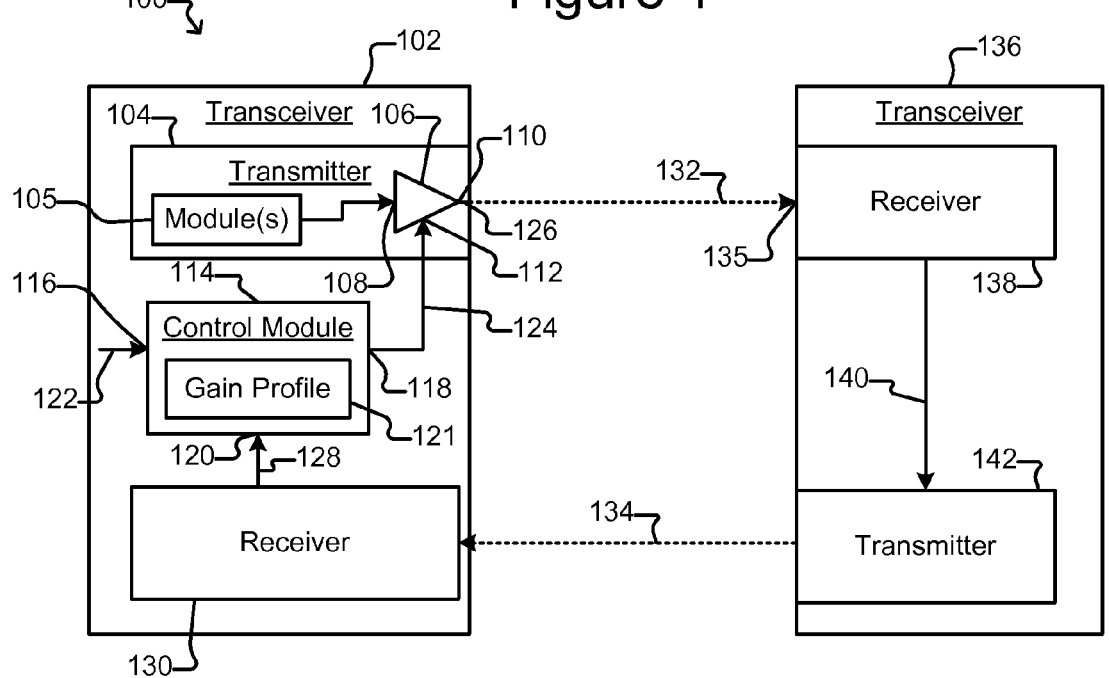
FIG. 1 illustrates an example of a communications system comprising a control module for modifying the estimated gain profile of an amplifier according to some embodiments of the invention.

FIG. 1 illustrates examples of an amplifier 106 and a control module 114 for modifying an estimated gain profile 121 of the amplifier 106, which can be stored in the control module 114. The estimated gain profile 121 is a representation of the gain response of the amplifier 106. In the example shown in FIG. 1, the amplifier 106 and control module 114 are part of a communications system 100 comprising transceivers 102 and 136 in which the amplifier 106 is part of a transmitter 104 in a first of the transceivers 102 that transmits a signal to a second of the transceivers 136. The communications system 100 of FIG. 1 is, however, but an example of an application of the amplifier 106 and control module 114. Indeed, the amplifier 106 and control module 114 can be used in any application, and thus in any device, system, network, or the like, in which an amplifier (e.g., a variable gain amplifier) is used. For ease of discussion and illustration, however, the amplifier 106 and control module 114 are described herein as part of the communications system 100.

As shown, the communications system 100 of FIG. 1 can comprise transceivers 102, 136 (although two transceivers 102, 136 are shown, there can be more). The communications system 100 can be any kind of system or network of interconnected devices, and the transceivers 102, 136 can be any type of communications apparatus appropriate to the communications system 100. For example, the communications system 100 can be a radio communications system, a sensor network, a computer network, a telephone system, or the like, and the transceivers 102, 136 can be components of a radio frequency (RF) wireless radio device, a sensor, a computer, a telephone, or the like.

As shown, the transceiver 102 can comprise a transmitter 104, a receiver 130, and the control module 114. The transmitter 104 can comprise one or more transmitter modules 105, which can prepare a signal to be transmitted to the transceiver 136. As shown, a signal prepared by the transmitter module(s) 105 can be provided to a signal input 108 of the amplifier 106. The amplifier 106 can amplify the signal at the signal input 108 in accordance with the gain response of the amplifier 106, and the amplifier 106 can provide at the output 110 an output signal 126. In the example shown in FIG. 1, the amplifier 106 can drive the output signal 126 onto a communications channel 132 to the transceiver 136.

Still referring to the transceiver 102, the receiver 130 can receive signals from a transmitter 142 in the transceiver 136 over another communications channel 134. The communications channels 132, 134 can be any type of communications channel including wireless communications channels suitable for wireless RF signals, light guides, wired channels comprising cables or twisted pairs of wires, or the like. The transmitter 104 and receiver 130 can accordingly be configured to transmit and receive signals appropriate for the respective communications channels 132, 134.

The amplifier 106 can be, for example, a variable gain amplifier. As shown in FIG. 1, the amplifier 106 can thus comprise a signal input 108, a control input 112, and an output 110. As noted, the amplifier 106 can produce at the output 110 an output signal 126, which can be an amplified version of the signal at the signal input 108. The control input 112 can control the gain of the amplifier 106 in accordance with the gain response of the amplifier 106. That is, different values of a control signal 124 at the control input 112 can set the amplifier 106 to output the output signal 126 at different amplification levels.

The estimated gain profile 121 stored in the control module 114 can be a representation of the gain response of the amplifier 106. That is, the estimated gain profile 121 can map a range of different values of the control signal 124 to a range of corresponding expected amplification levels at which the amplifier 106 is expected to produce the output signal 126. The term "amplification level" can mean power level, and "amplification level" can thus refer to the power level of the output signal 126 output by the amplifier 106. Alternatively, "amplification level" can refer to one or more other characteristics of the output signal 126 amplified by the amplifier 106.

Figure 2:
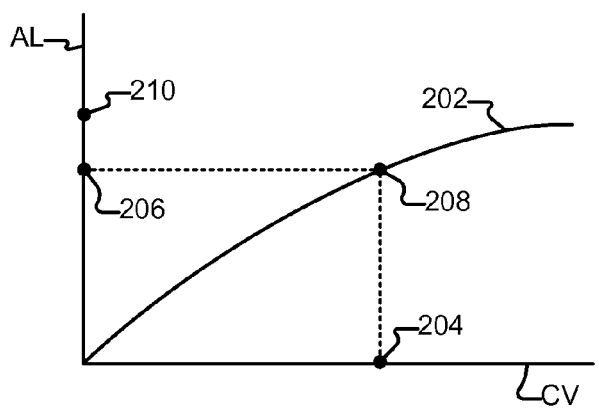
FIG. 2 illustrates an example of an estimated gain profile of the amplifier of FIG. 1.

FIG. 2 illustrates a generalized example of an estimated gain profile 202 that can be an example of the estimated gain profile 121 of FIG. 1. As shown, the estimated gain profile 202 maps a range of values of the control signal 124 at the control input 112 of the amplifier 106 along a horizontal axis CV to corresponding expected amplification levels of the output signal 126 along a vertical axis AL. That is, the estimated gain profile 202 maps values of the control signal 124 along the CV axis to expected amplification levels of the output signal 126 along the AL axis. For example, as shown in FIG. 2, a control signal 124 with a value CV 204 at the control input 112 of the amplifier 106 sets the amplifier 106 to produce an output signal 126 at the output 110 with an expected amplification level AL 206.

The estimated gain profile 202 can take any of many possible forms. For example, the estimated gain profile 202 can comprise one or more mathematical functions that map values CV of the control signal 124 to expected amplification levels AL of the output signal 126. Although shown in FIG. 2 as a continuous function, the estimated gain profile 202 need not be a continuous function but can comprise, for example, a plurality of functions.

The estimated gain profile 202 can be embodied in the control module 114 in any of a variety of ways. For example, the estimated gain profile 202 can be in the form of software (e.g., stored in the memory 504 as discussed below) and/or hard wired logic (e.g., that is part of the controller 502 as discussed below). Alternatively, the estimated gain profile 202 can be in a digital format such as a digital table or column vector, which can be stored in the memory 504 of FIG. 5 as discussed below.

Figure 3:
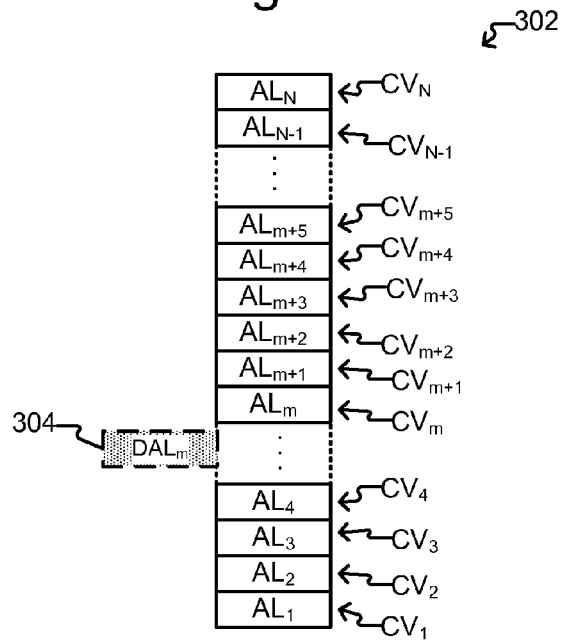
FIG. 3 illustrates an example of an estimated gain profile of the amplifier of FIG. 1 in the form of a digital memory column.

FIG. 3 illustrates an example of an estimated gain profile in the form of a digital column vector 302, which as shown, can be an N entry column vector, where N is an integer. The estimated gain profile 302 can be another example of the estimated gain profile 121.

In the estimated gain profile 302, each entry $CV_1$ through $CV_N$ corresponds to a different possible value of the control signal 124, and the expected amplification level $AL_1$ through $AL_N$ stored at a particular entry is the expected amplification level AL of the output signal 126 output by the amplifier 106 while the control signal 124 is set to the corresponding control value CV. Thus, for example, while the value of the control signal 124 is set to $CV_m$, the expected amplification level of the output signal 126 is $AL_m$. As another example, while the value of the control signal 124 is set to $CV_4$, the expected amplification level of the output signal 126 is $AL_4$.

In some embodiments, the amplifier 106 can be a digital amplifier. In such embodiments, the N different control values $CV_1$ through $CV_N$ can correspond to every possible value of the control signal 124. Alternatively, the N different control values $CV_1$ through $CV_N$ can correspond to a subset of every possible value of the control signal 124. The other possible values CV of the control signal 124 and corresponding expected amplification levels AL can be calculated from the estimated gain profile 302. For example, the expected amplification level AL of the output signal 126 for a control value CV that is between control values $CV_m$ and $CV_{m+1}$ can be an interpolated value between expected amplification levels $AL_m$ and $AL_{m+1}$.

Regardless of the particular form or format of the estimated gain profile 121 of the amplifier 106, the control module 114 can utilize the estimated gain profile 121 to set the amplifier 106 to a desired amplification level.

Referring again to FIG. 1 and describing now the control module 114, as shown, the control module 114 can comprise an amplification level input 116, a control output 118, and a feedback input 120. A desired amplification level signal 122 indicating a desired amplification level for the amplifier 106 can be provided to the control module 114 via the input 116. The control module 114 can use the estimated gain profile 121 of the amplifier 106 to provide via its output 118 a control signal 124 with the appropriate value to set the amplifier 106 to output the signal 126 at the desired amplification level. For example, if the estimated gain profile 121 of the amplifier 106 is the estimated gain profile 202 of FIG. 2, and the desired amplification level signal 122 corresponds to the amplification level 206, the control module 114 can utilize the estimated gain profile 202 of FIG. 2 to produce the control signal 124 at the value 204, which sets the amplifier 106 to output the signal 126 at the expected amplification level 206. Similarly, if the desired amplification level signal 122 corresponds to the amplification level $AL_m$ in FIG. 3, the control module 114 can utilize the estimated gain profile 302 to produce the control signal 124 at the value $CV_m$, which sets the amplifier 106 to output the signal 126 at the expected amplification level $AL_m$.

As noted, however, due to imprecision in the estimated gain profile 121, a change in the operating characteristics of the amplifier 106, a change in ambient conditions, and/or a variety of other possible causes, the amplifier 106 might not produce the output signal 126 at precisely the expected amplification level AL. An actual value of the amplification level of the output signal 126 produced by the amplifier 106 in response to a control signal 124 thus might not be the same as the expected amplification level AL in the estimated gain profile 121.

FIG. 2 illustrates an example in which a detected amplification level 210 of an output signal 126 produced by the amplifier 106 while the control signal 124 is set to the control value CV 204 is different than the expected amplification level AL 206. The detected amplification level 210 need not be directly measured but can be indirectly measured, detected, or determined. FIG. 3 illustrates another example in which the detected amplification level $DAL_m$ 304 of the output signal 126 produced by the amplifier 106 while the control signal 124 is set at the control value $CV_m$ is different than the expected amplification level $AL_m$.

Not only can the control module 114 utilize the estimated gain profile 121 of the amplifier 106 to set the control value CV of the control signal 124 in accordance with the desired amplification level signal 122, the control module 114 can also utilize detected values of amplification levels of output signals 126 produced by the amplifier 106 to modify the estimated gain profile 121 during operation of the amplifier 106. Detected values of the amplification level of the output signal 126 produced by the amplifier 106 can be provided to the control module 114 via the feedback input 120.

Figure 4:
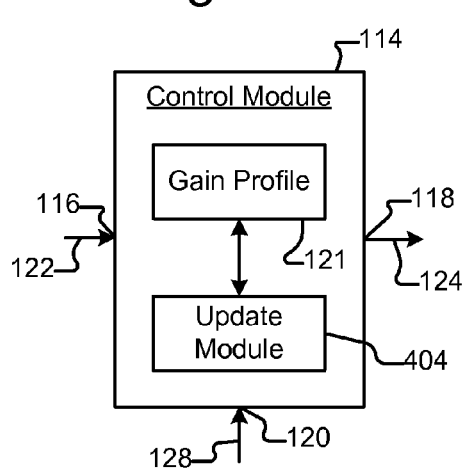
FIG. 4 shows an example of the control module of FIG. 1 according to some embodiments of the invention.

FIG. 4 illustrates a functional block diagram of an embodiment of the control module 114 that includes an update module 404 for modifying the estimated gain profile 121 utilizing a detected amplification level 128 of an output signal 126 produced by the amplifier 106 (see FIG. 1).

Figure 5:
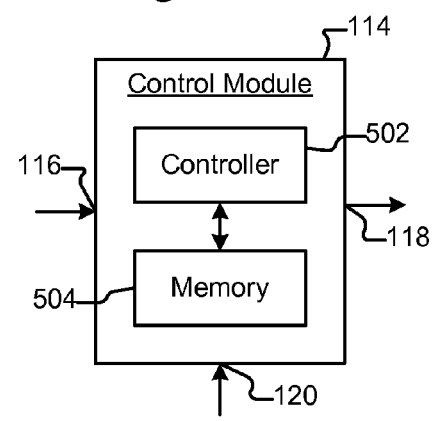
FIG. 5 illustrates an example of a configuration of the control module according to some embodiments of the invention.

In practice, as illustrated in FIG. 5, embodiments of the control module 114 can comprise electronic circuitry that includes an electronic controller 502 and a memory 504. The controller 502 can comprise, for example, a microprocessor, microcontroller, or the like configured to operate in accordance with machine readable instructions (e.g., software, firmware, microcode, or the like) stored as non-transitory signals in the memory 504. Alternatively or in addition, the controller 502 can comprise analog and/or digital logic circuitry. Such machine readable instructions and/or digital logic circuitry can cause the control module 114 to perform any of the functions and/or processes described herein as being performed by the control module 114. For example, the control module 114 can be configured by such machine readable instructions and/or digital logic circuitry to perform any one or more of the steps in the processes of FIGS. 6, 7, 10, and/or 11. The memory 504 can comprise one or more digital memory devices such as semiconductor, magnetic, and/or light based digital memory devices. The estimated gain profile 121 in FIG. 4 can, for example, by stored in the memory 504.

Figure 6:
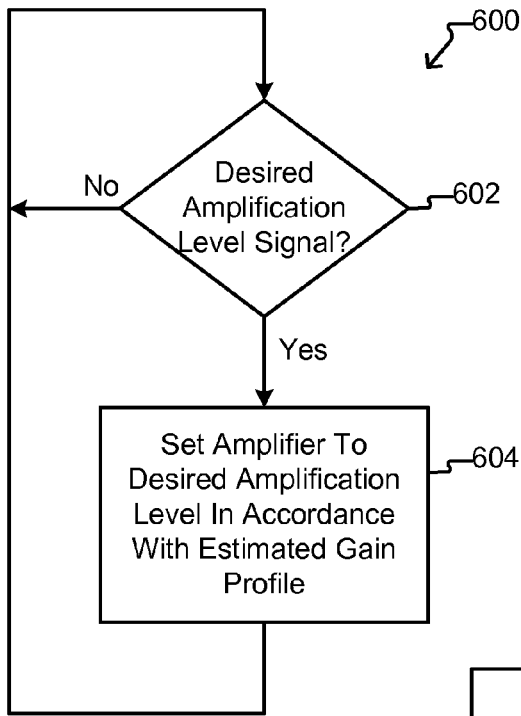
FIG. 6 shows a process illustrating an example of operation of the control module to set the amplifier of FIG. 1 to a desired amplification level in accordance with the estimated gain profile of the amplifier.

FIG. 6 illustrates a process 600 that can be an example of operation of the control module 114 to set the amplification level of the amplifier 106 during operation of the amplifier 106.

As shown, at step 602, the process 600 can wait for a desired amplification level signal 122, which as discussed above, can be received at the amplification level input 116 of the control module 114. At step 604, the process 600 can set the amplifier 106 to an amplification level that corresponds to the amplification level signal 122 received at step 602. The process 600 can do so by causing the control module 114 to produce at its output 118 a control signal 124 having a value obtained from the estimated gain profile 121 that corresponds to the desired amplification level signal 122 received at step 602. For example, if the estimated gain profile 121 is as illustrated in FIG. 2, and the process 600 receives at step 602 a desired amplification level signal 122 corresponding to 206 along the AL axis, the process 600 at step 604 can produce the control signal 124 with the corresponding value 204 on the CV axis. As another example, if the estimated gain profile 121 is as illustrated in FIG. 3, and the process 600 receives at step 602 a desired amplification level signal 122 corresponding to $AL_m$, the process 600 at step 604 can produce the control signal 124 with a value $CV_m$ that corresponds to the $AL_m$ entry in the column vector 302 (see FIG. 3).

As noted above, the control values $CV_1$ through $CV_N$ in FIG. 3 can be a sub-set of less than all of the possible control values CV of the control signal 124 to the amplifier 106. In such a case, the process 600 at step 604 may receive desired amplification level signals 122 that have a value between two of the expected amplification level $AL_1$ through $AL_N$, and the process 600 at step 604 can utilize interpolation techniques to determine a control value CV for the control signal 124 that is between the two $CV_1$ through $CV_N$ values that corresponds to the desired amplification level.

As shown in FIG. 6, the process 600 can repeatedly wait for a new desired amplification level signal 122 at step 602, and as new desired amplification level signals 122 are received at step 602, utilize the estimated gain profile 121 to provide different control values CV of the control signal 124 to set the amplifier 106 to different amplification levels.

Figure 7:
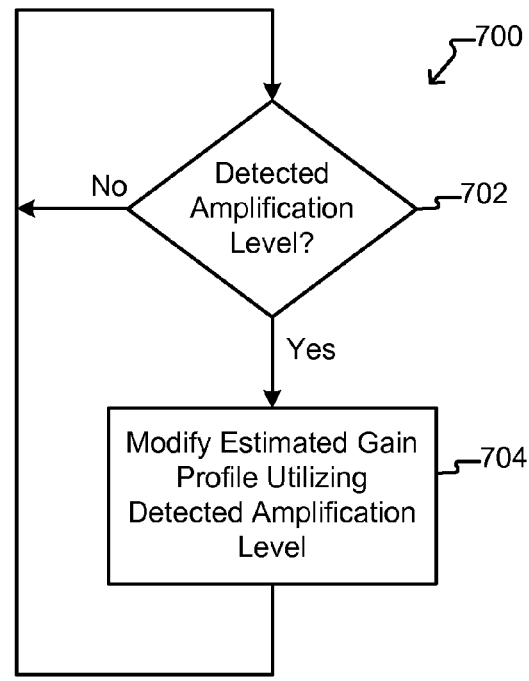
FIG. 7 illustrates a process of modifying the estimated gain profile of the amplifier utilizing a detected amplification level of the output of the amplifier according to some embodiments of the invention.

FIG. 7 illustrates a process 700 that can be an example of operation of the control module 114 to modify the estimated gain profile 121 of the amplifier 106 during operation of the amplifier 106. In some embodiments, the processes 600 and 700 can operate in parallel in the control module 114. Alternatively, the processes 600 and 700 can operate sequentially.

As shown in FIG. 7, at step 702, the process 700 can wait for a detected value 128 of the amplification level of an output signal 126 output by the amplifier 106. At step 704, the process 700 can modify the estimated gain profile 121 in accordance with the detected value 128 of an output signal 126 received at step 702. As illustrated in FIG. 1, the detected value 128 can be received at the feedback input 120 of the control module 114.

The detected value 128 received at step 702 can be detected (e.g., measured, determined, or the like) at any of a variety of locations. For example, in the system 100 of FIG. 1, the detected value 128 can be detected within the transceiver 136, which can be located remotely from the transceiver 102. For example, the detected value 128 can be detected at an input 135 to the receiver 138 in the second transceiver 136. Alternatively, the detected value 128 can be detected at other locations in the transceiver 136. If the detected value 128 is detected in the transceiver 136, the detected value 128 can be provided from the transceiver 136 through the channel 134 to the receiver 130 from which the detected value 128 can be provided to the feedback input 120 of the control module 114 generally as shown in FIG. 1.

Figure 8A:
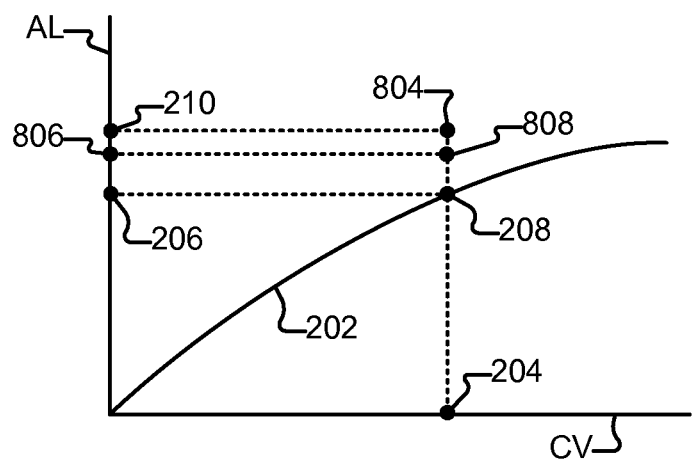
FIG. 8A shows the estimated gain profile of FIG. 2 with an example of a detected amplification level and a new expected amplification level determined according to some embodiments of the invention.
Figure 8B:
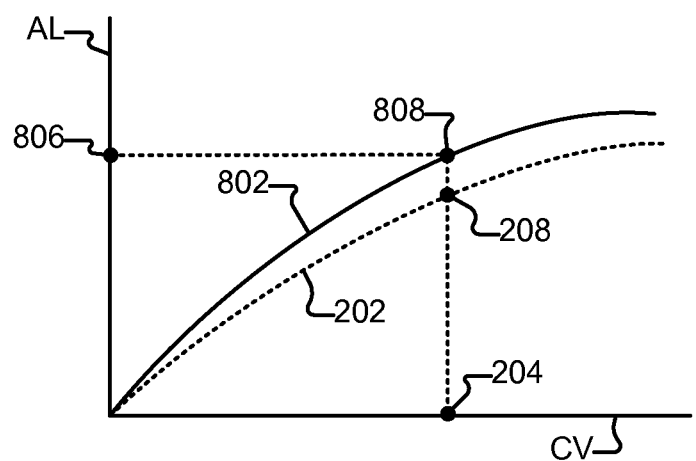
FIG. 8B shows the estimated gain profile of FIG. 2 modified in accordance with the new expected amplification level according to some embodiments of the invention.

Returning to FIG. 7, at step 704, the process 700 can utilize the detected value 128 received at step 702 to modify the estimated gain profile 121 of the amplifier 106. FIGS. 8A and 8B illustrate an example of modifying at step 704 the estimated gain profile 202 of FIG. 2.

As discussed above, FIG. 2 illustrates an example in which the amplifier 106 was set with a control signal 124 having a value of 204 to produce amplified signals 126 at the expected amplification level 206, but the detected amplification level of an output signal 126 is 210. FIG. 8A illustrates the foregoing and also shows that point 804—not point 208 on the estimated gain profile 202—maps the control signal value 204 to the detected amplification level 210.

At step 704, the process 700 of FIG. 7 can modify the estimated gain profile 202 by changing the point 208 to a new point 808 that more accurately maps the control signal value 204 to the detected amplification level 210. Although not shown in FIG. 8A, in some embodiments, the process 700 can, at step 704, simply replace the point 208 in the estimated gain profile 202 with the point 804 that corresponds to the detected amplification level 210.

Figure 10:
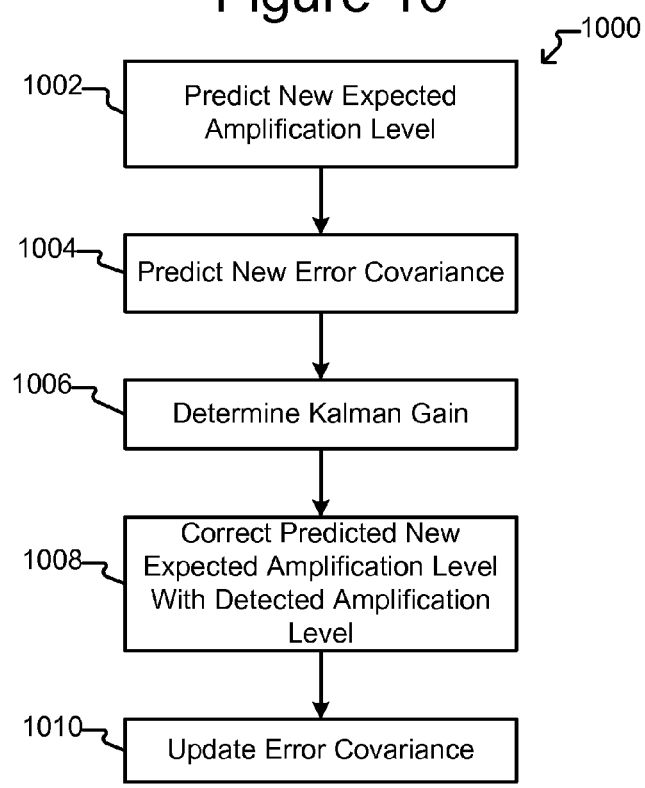
FIG. 10 illustrates an example of a Kalman filtering process for modifying the estimated gain profile of FIG. 2 utilizing a detected amplification level of the output of the amplifier according to some embodiments of the invention.

There can be, however, some uncertainty in the accuracy of the detected amplification level 210. Thus, in some embodiments, as illustrated in FIG. 8A, more accurate results can be obtained by determining a new expected amplification level 806 for the control signal value 204 as a function of the expected amplification level 206 and the detected amplification level 210. For example, the new expected amplification level 806 can be, as shown in the example of FIG. 8A, between the expected amplification level 206 and the detected amplification level 210. For example, the new expected amplification level 806 can be an average or a weighted average of the expected amplification level 206 and the detected amplification level 210. As another example, the new expected amplification level 806 can be determined from a filtering (e.g., Kalman, Bayesian, or the like) operation involving at least the expected amplification level 206 and the detected amplification level 210. As will be discussed, FIG. 10 illustrates a process 1000 in which Kalman filtering is used to determine the new expected amplification level 806 from the expected amplification level 206 and the detected amplification level 210.

Regardless of how the new expected amplification level 806 for the control signal value 204 is determined, the new expected amplification level 806 can correspond to a new point 808 that maps the control signal value 204 to the new expected amplification level 806 as shown in FIG. 8A. As shown in FIG. 8B, the estimated gain profile 202 can be modified by replacing the point 208 with the new point 808. Similar determinations can be made with regard to other points on the estimated gain profile 202 to produce a modified estimated gain profile 802 as shown. As part of step 704 of FIG. 7, the process 700 can replace the estimated gain profile 202 with the new estimated gain profile 802 as the estimated gain profile 121 in the control module 114 (see FIG. 4), and thereafter, future performances of the process 600 can utilize as the estimated gain profile 121 the modified estimated gain profile 802. The new estimated gain profile 802 can thus replace 202 as the estimated gain profile 121 in the control module. As the control module 114 repeatedly executes the process 700, the control module 114 can thus repeatedly update the estimated gain profile 121.

Figure 9:
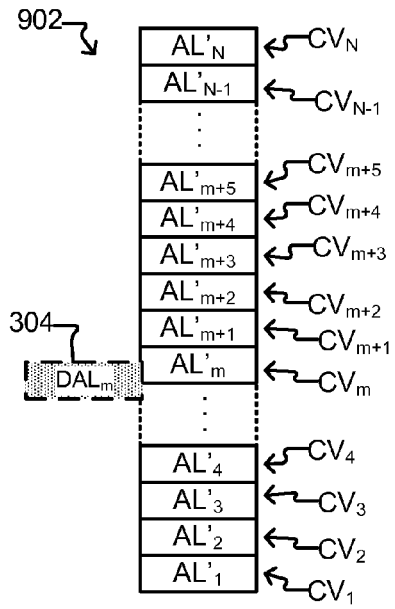
FIG. 9 shows the estimated gain profile of FIG. 3 modified in accordance with new expected amplification levels determined from a detected amplification level according to some embodiments of the invention.

FIG. 9 illustrates an example of step 704 of FIG. 7 in which the estimated gain profile 302 of FIG. 3 is modified in accordance with the detected amplification level $DAL_m$ 304. As discussed above, FIG. 3 illustrates an example in which the amplifier 106 is set with a control signal 124 value $CV_m$ to produce the output signal 126 at an expected amplification level $AL_m$, but the detected amplification level $DAL_m$ 304 of the output signal 126 is different than the expected amplification level $AL_m$. FIG. 9 illustrates the foregoing.

At step 704, the process 700 of FIG. 7 can modify the estimated gain profile 302 of FIG. 3 by changing the value $AL_m$ stored in the $CV_m$ entry of the estimated gain profile 302 to a modified value $AL'_m$ that more accurately maps the control signal 124 value $CV_m$ to the detected amplification level $DAL_m$ 304. In some embodiments, the process 700 can, at step 704, simply make the modified expected amplification value $AL'_m$ equal to the detected amplification level $DAL_m$ 304.

Figure 11:
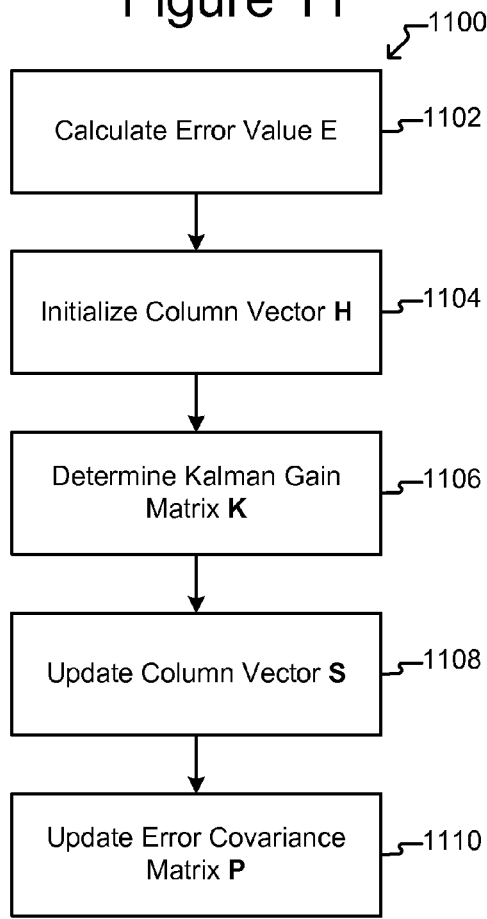
FIG. 11 illustrates an example of a Kalman filtering process for modifying the estimated gain profile of FIG. 3 utilizing a detected amplification level of the output of the amplifier according to some embodiments of the invention.

As is noted above, however, because of possible uncertainty in the accuracy of the detected amplification level $DAL_m$ 304, more accurate results can be obtained by determining a modified expected amplification level $AL'_m$ for the control signal 124 value $CV_m$ as a function of the expected amplification level $AL_m$ and the detected amplification level $DAL_m$ 304. For example, the new expected amplification level $AL'_m$ can be between the expected amplification level $AL_m$ and the detected amplification level $DAL_m$ 304. For example, the new expected amplification level $AL'_m$ can be an average or a weighted average of the expected amplification level $AL_m$ and the detected amplification level $DAL_m$ 304. As another example, the new expected amplification level $AL'_m$ can be determined from a filtering operation (e.g., Kalman, Bayesian, or the like) involving at least the expected amplification level $AL_m$ and the detected amplification level $DAL_m$ 304. FIG. 11, which is discussed below, illustrates a process 1100 in which Kalman filtering is used to determine the new expected amplification level $AL'_m$ from the expected amplification level $AL_m$ and the detected amplification level $DAL_m$ 304.

Regardless of how the new expected amplification level $AL'_m$ is determined, the estimated gain profile 302 can be modified by replacing the expected amplification level $AL_m$ with the new expected amplification level $AL'_m$. Similar determinations can be made with regard to some or all of the other control values $CV_1$ through $CV_N$ of the estimated gain profile 302 to produce a modified estimated gain profile 902 as shown in FIG. 9. For example, in the example shown in FIG. 9, new expected amplification levels $AL'_1$ through $AL'_N$ are provided for all of the control values $CV_1$ through $CV_N$ of the control signal 124. Alternatively, new expected amplification levels ALs can be provided for fewer than all of the CVs.

Regardless, as part of step 704 of FIG. 7, the process 700 can replace the estimated gain profile 302 with the modified estimated gain profile 902 as the estimated gain profile 121 in the control module 114 (see FIG. 4), and thereafter, future performances of the process 600 of FIG. 6 can utilize as the estimated gain profile 121 the new estimated gain profile 902. The new estimated gain profile 902 can thus replace 302 as the estimated gain profile 121 in the control module. As the control module 114 repeatedly executes the process 700, the control module 114 can thus repeatedly update the estimated gain profile 121.

As mentioned, in some embodiments, Kalman filtering can be used at step 704 of FIG. 7 to modify the estimated gain profile 121. FIG. 10 illustrates a process 1000 that can be an example of Kalman filtering to perform step 704 on the estimated gain profile 202 of FIGS. 2 and 8A to produce the modified estimated gain profile 802 in FIG. 8B. FIG. 11 similarly illustrates a process 1100 that can be an example of Kalman filtering to perform step 704 on the estimated gain profile 302 of FIG. 3 to produce the modified estimated gain profile 902 of FIG. 9.

Turning first to FIG. 10, it is noted that in the discussion of FIG. 10: $AL_{k-1}$ is the amplification level 206 that corresponds to the control signal 124 value 204, $Z_k$ is the detected amplification level 210 of a signal 126 output by the amplifier 106 while the amplifier 106 is set to produce signals 126 at the amplification level AL 206, and $AL_k$ is the new amplification value 806 to be determined by Kalman filtering. In addition, the following are standard elements (e.g., constants, functions, matrices) of Kalman filters: A is a state vector or matrix, B is a control input vector or matrix, and H is a measurement matrix; $U_k$ is a control input; $P_{k-1}$ is the current error covariance matrix; $P_k$ is a new error covariance matrix; Q is process noise covariance matrix; R is a feedback noise covariance matrix; K is a Kalman gain; and I is an identity matrix. The following can be determined and/or initialized using known Kalman filtering techniques: A, B, H, Q, R, and $P_{k-1}$.

As shown in FIG. 10, at step 1002, the process 1000 can determine $AL_k\hat{}$ (as noted $\hat{}$ denotes an estimated value, and $AL_k\hat{}$ is thus an estimated value of $AL_k$, which is the new expected amplification level 806 to be determined). Per known Kalman filtering techniques, $AL_k\hat{}=A*AL_{k-1}+B*U_k$. In some embodiments, the control input $U_k$ can be zero, and A can be one or an identity matrix such that $A*AL_{k-1}$ equals $AL_{k-1}$. Thus, in some embodiments, $AL_k\hat{}=AL_{k-1}$ at step 1002.

At step 1004, the process 1000 can determine $P_k\hat{}$ (as noted $\hat{}$ denotes an estimated value, and $P_k\hat{}$ is thus an estimated value of $P_k$). Per known Kalman filtering techniques, in some embodiments, $P_k\hat{}=A*P_{k-1}*A^T+Q$ at step 1004.

At step 1006, the process 1000 can determine the Kalman gain K. Per known Kalman filtering techniques, in some embodiments, $K=(P_k\hat{}*H^T)/(H*P_k\hat{}*H^T+R)$ at step 1006.

At step 1008, the process 1000 can determine $AL_k$. Per known Kalman filtering techniques, in some embodiments, $AL_k=AL_k\hat{}+K*(Z_k-H*AL_k\hat{})$ at step 1008. As noted above, $AL_k\hat{}$ can be set at step 1002 equal to $AL_{k-1}$.

At step 1010, the process 1000 can determine $P_k$. Per known Kalman filtering techniques, in some embodiments, $P_k=P_k\hat{}*(K-KH)$ at step 1010.

As noted, the result of process 1000—the value for $AL_k$—can be the new expected amplification level 806 for the control signal value 204 as shown in FIGS. 8A and 8B, which can thus be determined using Kalman filtering involving at least the expected amplification level 206 (which corresponds to $AL_{k-1}$ in the discussion above) for the control signal value 204 and the detected amplification level 210 (which corresponds to $Z_k$ in the discussion above) for the control signal 124 value 204.

As noted, the process 1100 of FIG. 11 is another example of Kalman filtering to perform step 704 of FIG. 7. The process 1100, however, can be suited for use with a digital estimated gain profile like the estimated gain profile 302 of FIGS. 3 and 9.

Figure 12:
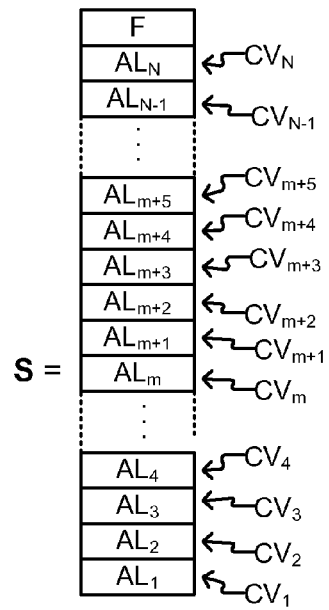
FIG. 12 shows an example of a digital column vector comprising the estimated gain profile of FIG. 3 and a correction factor for use in the process of FIG. 11 according to some embodiments of the invention.

FIG. 12 illustrates an example of a digital column vector S that can be utilized with the process 1100. As shown in FIG. 12, the column vector S can be an N+1 column vector that includes the estimated gain profile 302 of FIG. 3 in entries 1 through N and a correction factor F in entry N+1.

In some embodiments, the correction factor F can be initialized to zero, and the rest of the column vector S can be initialized to correspond to an initial estimated gain profile 302 of the amplifier 106, such as an estimated gain profile 302 specified by the manufacturer of the amplifier 106. Alternatively, the entire column vector S can be initialized to zeros, and repeated performances of processes 600 and 700 can generate values for each of the N+1 entries of the column vector S.

Before executing the process 1100, an N+1 by N+1 covariance error matrix P can be initialized as illustrated in FIG. 13, wherein Γ is a correlation coefficient between adjacent ones of the N control values $CV_1$ through $CV_N$ of the amplifier 106, and X is an initial process covariance value. In some embodiments, the correlation coefficient Γ can be between zero and one, and X can be any positive number (e.g., five).

The foregoing initialization can be performed prior to starting the process 700 of FIG. 7. Thereafter, the process 700 can be started, and the process 1100 can be executed as an implementation of step 704 each time step 704 is performed in response to receiving a detected amplification level DAL 128 of the output signal 126 at step 702. FIG. 11 is discussed herein with respect to receiving a detected amplification level $DAL_m$ of the output signal 126 produced while the amplifier 106 was set with a control signal $CV_m$ and thus expected to produce the output signal 126 at an expected amplification level $AL_m$. Although "m" is shown in FIGS. 3, 9, 12, 14, and 15 is being somewhere in the middle of the estimated gain profile 302, "m" can correspond to any of the entries 1 through N of the estimated gain profile 302.

Turning now to FIG. 11, the process 1100 can, at step 1102, calculate an error value E (which in some embodiments can be a vector or a matrix) from the detected amplification level $DAL_m$ 128 received at step 702 of FIG. 7. The error value E can be calculated as follows: $E=DAL_m-S(m)-S(N+1)$. In the foregoing formula, $DAL_m$ is the detected amplification level 128 received at step 702 of FIG. 7, $S(m)$ is the expected amplification level $AL_m$ of the $CV_m$ entry in the column vector S, and $S(N+1)$ is the correction factor F in the column vector S.

Referring again to FIG. 11, at step 1104, the process 1100 can initialize an N+1 column vector H, which can relate the detected amplification levels to states in the Kalman filtering as is known in the field of Kalman filtering. As shown in FIG. 14, the vector H can be initialized to have a value "x" in the N+1 entry that corresponds to the correction factor F of the column vector S and a value "y" in the mth entry, which corresponds to the current expected amplification level $AL_m$. The sum of the values "x" and "y" can be one. There can be zeros in all other entries of the column vector H.

At step 1106 of FIG. 11, the process 1100 can calculate a Kalman gain matrix K, which can be accomplished as follows: $K=(P*H^T)/(H*P*H^T+R)$, where R is a measurement covariance matrix. In some embodiments R can be simplified to a standard deviation a, which can be any positive number (e.g., 0.1).

Figure 15:
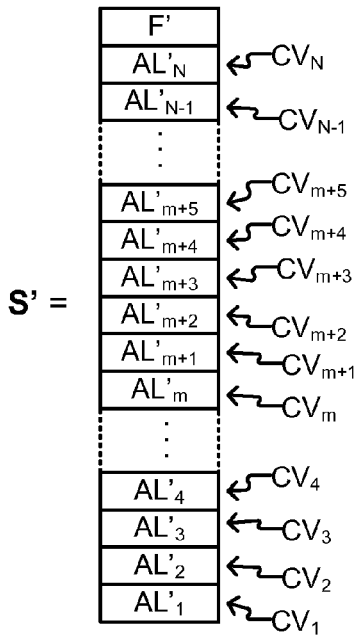
FIG. 15 illustrates modification of the column vector of FIG. 12.

At step 1108 of FIG. 11, the process 1100 can modify the column vector S of FIG. 12 utilizing the error value E weighted in accordance with the Kalman gain K. For example, at step 1108, the vector S can be modified for each entry 1 through N+1 as follows: $S'=S+K*E$, where S' is the modified vector S. In the example shown in FIGS. 3, 9, and 12, the foregoing calculation can yield the modified vector S' as shown in FIG. 15. As shown, the modified column vector S' can be the modified estimated gain profile 902 in entries corresponding to the control values $CV_1$ through $CV_N$, and there can be a modified correction value F' in the N+1 entry of the modified column vector S'.

At step 1110, the process 1100 can update the error covariance matrix P for use in the next performance of the process 1100. For example, the matrix P can be updated as follows: $P'=P-K*H*P+Q$, wherein P' is the updated matrix P for use during the next performance of the process 1100, and Q is an N+1 by N+1 process noise covariance matrix. In some embodiments, Q can be all zeros except for a process variance constant (e.g., one) in the lower right corner of the matrix.

The column vector S and then the modified column vector S' can be stored, for example, in the memory 504 of the control module 114 (see FIG. 5). The estimated gain profile 302 portion of the column vector S initially and thereafter the estimated gain profile 902 portion of the most recent version of the modified column vector S' can be utilized by the process 600 as the estimated gain profile 121 generally as discussed above. Similarly, the column vector S initially and thereafter the modified column vector S' can be utilized by the process 700 generally as discussed above, and the column vector S initially and thereafter each new version of the column vector S' can be stored in the memory 504 as the estimated gain profile 121.

As noted above, the control values $CV_1$ through $CV_N$ in the estimated gain profile 302 and thus the column vector S of FIG. 12 can be a sub-set of less than all the possible control values CV of the control signal 124 to the amplifier 106. In such a case, the detected amplification level $DAL_m$ 304 received at step 702 may correspond to an expected amplification level AL that is between two of the expected amplification levels $AL_1$ through $AL_N$ and thus also correspond to a control value CV that is between two of the control values $CV_1$ through $CV_N$. In such a case, the step 704, regardless of how performed, can be performed in accordance with interpolated values of the detected amplification level DAL, the expected amplification level AL, and control value CV.

Figure 16:
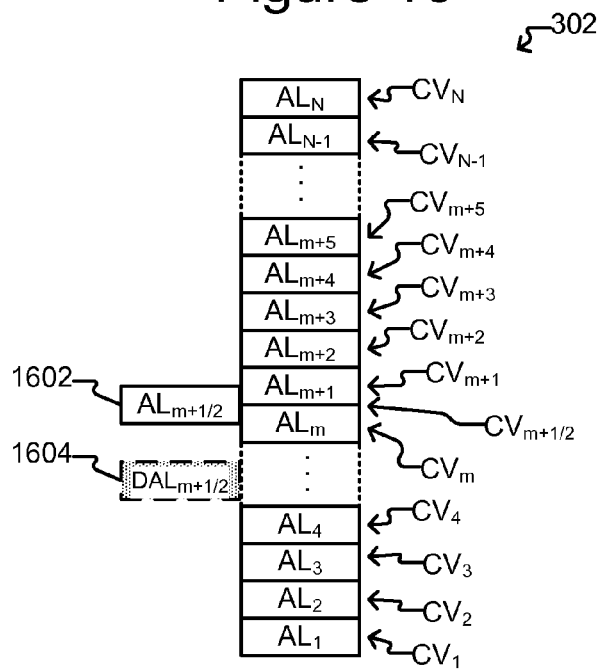
FIG. 16 shows the estimated gain profile of FIG. 3 illustrating interpolation according to some embodiments of the invention.

FIG. 16 illustrates an example. FIG. 16 illustrates the estimated gain profile 302 of FIG. 3. With reference to the processes 600 and 700 of FIGS. 6 and 7 (as discussed above), as shown in FIG. 16, a desired amplification signal $AL_{m+1/2}$ 1602 is received as the desired power level signal 122 at step 602 of process 600. There is, however, no entry for $AL_{m+1/2}$ 1602 in the gain profile 302; rather, $AL_{m+1/2}$ 1602 is between entries $AL_m$ and $AL_{m+1}$. At step 604 of FIG. 6, the process 600 therefore outputs an interpolated value $CV_{m+1/2}$ of the control signal 124 to the control input 112 of the amplifier 106, where $CV_{m+1/2}$ is interpolated from the entries $CV_m$ and $CV_{m+1}$ in the estimated gain profile 302 generally as illustrated in FIG. 16. Thereafter, the detected amplification level $DAL_{m+1/2}$ 1604 (see FIG. 16) is received at step 702 of the process 700 of FIG. 7. Generally as discussed above, the detected amplification level $DAL_{m+1/2}$ 1604 is different than the expected amplification level $AL_{m+1/2}$ 1602. Using interpolation, an expected amplification level $AL_m$ and a detected amplification level $DAL_{m+1/2}$ can be calculated from the expected amplification level $AL_{m+1/2}$ 1602 and detected amplification level $DAL_{m+1/2}$ 1604 and utilized in the process 1100 of FIG. 11 generally as discussed above. Alternatively, the process 1100 can be performed using the detected amplification level $DAL_{m+1/2}$ 1604, the expected amplification level $AL_{m+1/2}$ 1602 as an interpolated value in the column vector S (see FIG. 12), and appropriately interpolated values of the covariance matrix P (see FIG. 13) and the measurement matrix H (see FIG. 14) but otherwise generally in accordance with the discussion of FIG. 11 above.

Although specific embodiments and applications of the invention have been described in this specification, these embodiments and applications are exemplary only, and many variations are possible.

We claim:

1. A process of modifying an estimated gain profile of an electronic variable gain amplifier (VGA), said process comprising:
   obtaining said estimated gain profile of said VGA stored in an electronic memory device, said estimated gain profile comprising data stored in said memory device representing a plurality of different expected amplification levels each mapped to a different one of a plurality of different control signal values;
   providing one of said control signal values of said estimated gain profile to said VGA;
   said VGA outputting in response to said one of said control signal values provided to said VGA an output signal;
   receiving a detected amplification level of said output signal; and
   modifying said estimated gain profile in said memory device utilizing said detected amplification level and one of said expected amplification levels mapped in said estimated gain profile to said one of said control signal values provided to said VGA.

2. The process of claim 1, wherein said modifying comprises:
    utilizing said detected amplification level and said one of said expected amplification levels to determine a new expected amplification level that is different than said one of said expected amplification levels, and
    replacing said one of said expected amplification levels with said new expected amplification level in said estimated gain profile stored in said memory device so that:
        prior to said replacing, said one of said control signal values is mapped to said expected amplification level in said estimated gain profile stored in said memory device, and
        after said replacing, said one of said control signal values is mapped to said new expected amplification level in said estimated gain profile stored in said memory device.

3. The process of claim 2, wherein said new expected amplification level is between said one of said expected amplification levels and said detected amplification level.

4. The process of claim 2, wherein said modifying comprises determining said new expected amplification level by performing a digital filtering operation utilizing said one of said expected amplification levels and said detected amplification level.

5. The process of claim 4, wherein said filtering operation comprises Kalman filtering.

6. The process of claim 2, wherein said modifying comprises utilizing Kalman filtering with said one of said expected amplification levels of said estimated gain profile and said detected amplification level as inputs to determine said new expected amplification level.

7. The process of claim 1, wherein said estimated gain profile comprises N entries of a column vector S, wherein each of said N entries corresponds to a different one of said control signal values and contains a corresponding one of said expected amplification levels, where N is a number of entries of said column vector S.

8. The process of claim 1 further comprising:
    transmitting said output signal from a first transceiver in which said amplifier is disposed to a second transceiver;
    determining said detected amplification level of said output signal within said second transceiver; and
    receiving at said first transceiver from said second transceiver said detected amplification level.

9. The process of claim 1 further comprising detecting said detected amplification level in an electronic device located remotely from said amplifier.

10. A process of modifying an estimated gain profile of an electronic amplifier, wherein said estimated gain profile maps control signal values to expected amplification levels, said process comprising:
    outputting from said amplifier an output signal while said amplifier is set by one of said control signal values to produce said output signal at one of said expected amplification levels;
    receiving a detected amplification level of said output signal; and
    modifying said estimated gain profile utilizing said detected amplification level and said one of said expected amplification levels,
    wherein:
        said estimated gain profile comprises N entries of a column vector S, wherein each of said N entries corresponds to a different one of said control signal values and contains a corresponding one of said expected amplification levels,
        said column vector S comprises an entry containing a correction factor, and
        said modifying comprises determining a new column vector S' in accordance with the following: S'=S+K*E, where K is a Kalman gain matrix and E is a function of said detected amplification level.

11. The process of claim 10, wherein $E=AL_0-S(m)-S(N+1)$, wherein $AL_0$ is said detected amplification level, $S(m)$ is said one of said amplification levels at an $m^{th}$ one of said entries of said column vector S, and $S(N+1)$ is said correction factor.

12. The process of claim 11, wherein:
    said Kalman gain matrix K is a function of an N+1 by N+1 error covariance matrix P and an N+1 column vector H and a measurement covariance matrix R;
    said column vector H contains a zero in all entries except H(m) and H(N+1), where m is an mth one of said entries of said column vector H.

13. The process of claim 12, wherein said Kalman gain matrix $K=(P*H^T)/(H*P*H^T+R)$, where R is a measurement covariance matrix of said detected amplification level and $H^T$ is said column vector H transposed.

14. A digital electronic control module comprising:
    a digital memory in which is stored data comprising an estimated gain profile of an electronic variable gain amplifier (VGA), said data of said estimated gain profile representing a plurality of different expected amplification levels each mapped to a different one of a plurality of control signal values, each said expected amplification level representing an expected amplification level of a signal output by said VGA in response to a corresponding said control signal value to which said expected amplification level is mapped being provided to said VGA; and
    an electronic digital controller configured to modify said estimated gain profile in said digital memory in accordance with one of said expected amplification levels of said estimated gain profile and a detected amplification level of a signal output by said amplifier while said VGA is set with one of said control signal values to which said one of said expected amplification levels is mapped in said estimated gain profile.

15. The control module of claim 14, wherein said controller is further configured to modify said estimated gain profile by changing said estimated gain profile to map said one of said control signal values to a new expected amplification level that is different than said one of said expected amplification levels.

16. The control module of claim 15, wherein said controller comprises a digital filter configured to determine said new expected amplification level utilizing said one of said expected amplification levels and said detected amplification level.

17. The control module of claim 16, wherein said digital filter comprises a Kalman filter.

18. The control module of claim 17, wherein:
    said estimated gain profile comprises N entries of a column vector S stored in said memory, wherein each of said N entries corresponds to a different one of said control signal values and contains a corresponding one of said expected amplification levels, and where N is a number of entries of said column vector S, and
    said controller is further configured to modify said estimated gain profile by applying said Kalman filter to said column vector S.

19. The control module of claim 14, wherein said estimated gain profile comprises N entries of a column vector S stored in said memory, wherein each of said N entries corresponds to a different one of said control signal values and contains a corresponding one of said expected amplification levels.

20. The control module of claim 19, wherein said controller is further configured to modify said estimated gain profile by applying a digital filter to said column vector S.

21. The control module of claim 20, wherein said controller is further configured to apply said digital filter to said column vector S with inputs to said filter comprising said one of said estimated amplification levels and said detected amplification level.

22. The control module of claim 21, wherein said digital filter is a Kalman filter.

23. A digital electronic control module comprising:
- a digital memory comprising an estimated gain profile mapping control signal values to expected amplification levels of an electronic amplifier; and
- an electronic digital controller configured to modify said estimated gain profile in said digital memory in accordance with a detected amplification level of a signal output by said amplifier while said amplifier is set with one of said control signal values to produce said output signal at one of said expected amplification levels;

wherein:
- said controller is further configured to modify said estimated gain profile by changing said estimated gain profile to map said one of said control signal values to a new expected amplification level that is different than said one of said expected amplification levels,
- said controller comprises a Kalman digital filter configured to determine said new expected amplification level utilizing said one of said expected amplification levels and said detected amplification level,
- said estimated gain profile comprises N entries of a column vector S stored in said memory, wherein each of said N entries corresponds to a different one of said control signal values and contains a corresponding one of said expected amplification levels, where N is a number of entries of said column vector S,
- said controller is further configured to modify said estimated gain profile by applying said Kalman filter to said column vector S,
- said column vector S stored in said memory comprises an entry containing a correction factor that is a positive number, and
- said controller is further configured to modify said estimated gain profile by determining a new column vector S' in accordance with the following: S'=S+K*E, where K is a Kalman gain matrix and E is a function of said detected amplification level.

* * * * *